US012736581B2

(12) United States Patent
Lee et al.

(10) Patent No.: US 12,736,581 B2
(45) Date of Patent: Sep. 15, 2026

(54) INSERT INSERTED TO TRAY FOR TRANSPORTING SEMICONDUCTOR PRODUCTS, TRAY INCLUDING THE INSERT, AND SEMICONDUCTOR PRODUCT TEST SYSTEM INCLUDING THE INSERT

(71) Applicant: ATECO INC., Gunpo-si (KR)

(72) Inventors: Taek Seon Lee, Hwaseong-si (KR); Ho Nam Kim, Seongnam-si (KR); Sung Chul Moon, Gunpo-si (KR); Han Su Bae, Siheung-si (KR)

(73) Assignee: ATECO INC., Gunpo-si (KR)

( * ) Notice: Subject to any disclaimer, the term of this patent is extended or adjusted under 35 U.S.C. 154(b) by 162 days.

(21) Appl. No.: 18/790,667

(22) Filed: Jul. 31, 2024

(65) Prior Publication Data

US 2025/0362341 A1 Nov. 27, 2025

(30) Foreign Application Priority Data

May 21, 2024 (KR) ........................ 10-2024-0065951

(51) Int. Cl.
*G01R 31/28* (2006.01)
*G01R 1/04* (2006.01)

(52) U.S. Cl.
CPC ....... *G01R 31/2893* (2013.01); *G01R 1/0433* (2013.01)

(58) Field of Classification Search
CPC .............. G01R 31/2893; G01R 1/0433; G01R 31/2867; G01R 31/2863; G01R 31/2887; G01R 31/2889
See application file for complete search history.

(56) References Cited

U.S. PATENT DOCUMENTS

| | | | | |
|---|---|---|---|---|
| 11,579,189 B2 * | 2/2023 | Arai | G01R 31/2874 | |
| 11,714,124 B2 * | 8/2023 | Horino | G01R 31/2887 | 324/757.04 |
| 12,174,248 B2 * | 12/2024 | Ranganathan | G01R 31/2893 | |
| 2009/0245982 A1 * | 10/2009 | Na | G01R 31/2893 | 414/226.04 |
| 2022/0137092 A1 * | 5/2022 | Ranganathan | G01R 1/04 | 324/750.25 |
| 2023/0341462 A1 * | 10/2023 | Suda | G01R 1/06794 | |

FOREIGN PATENT DOCUMENTS

| | | |
|---|---|---|
| CN | 111077403 A | 4/2020 |
| CN | 114019346 A | 2/2022 |
| JP | 2000-356665 A | 12/2000 |
| KR | 10-2017-0006082 A | 1/2017 |
| KR | 10-2020-0112761 A | 10/2020 |

* cited by examiner

*Primary Examiner* — Giovanni Astacio-Oquendo

(57) ABSTRACT

A test tray for testing a semiconductor product according to an embodiment of the disclosure may include a tray and an insert comprising an accommodating portion configured to accommodate the semiconductor product and inserted into the tray. The accommodating portion may have a first posture at a first angle to the tray to accommodate the semiconductor product, and a second posture at a second angle to the tray to test the semiconductor product.

14 Claims, 17 Drawing Sheets

FIG. 1

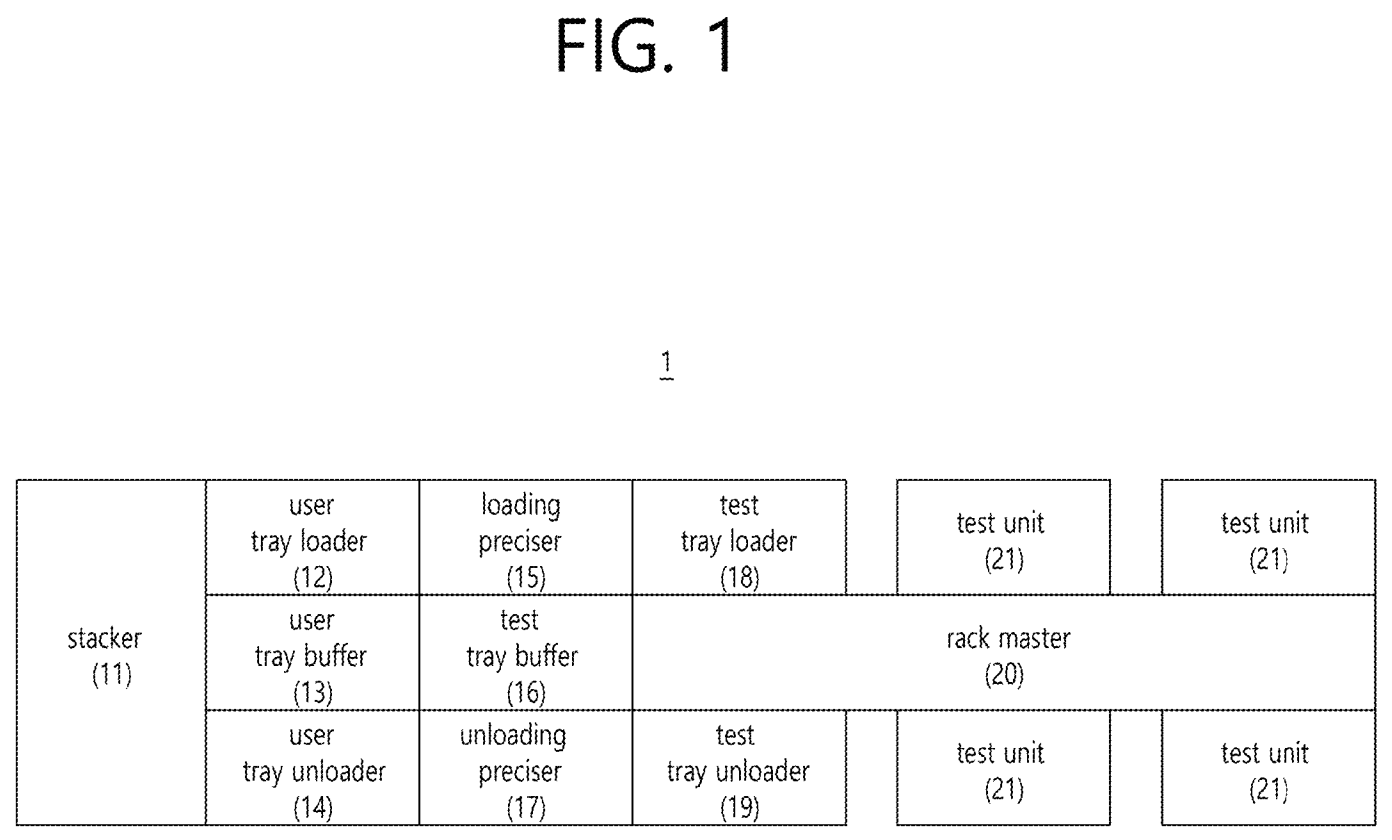

1 stacker (11)

user tray loader (12)

user tray buffer (13)

user tray unloader (14)

loading preciser (15)

test tray buffer (16)

unloading preciser (17)

test tray loader (18)

test tray unloader (19)

rack master (20)

test unit (21)

test unit (21)

test unit (21)

test unit (21)

INSERT INSERTED TO TRAY FOR TRANSPORTING SEMICONDUCTOR PRODUCTS, TRAY INCLUDING THE INSERT, AND SEMICONDUCTOR PRODUCT TEST SYSTEM INCLUDING THE INSERT

CROSS REFERENCE TO RELATED APPLICATION

This application is based on and claims priority under 35 U.S.C. § 119 to Korean Patent Application No. 10-2024-0065951 filed on May 21, 2024 in the Korean Intellectual Property Office, the disclosure of which is incorporated by reference herein in its entirety.

BACKGROUND OF THE INVENTION

Field of the Invention

The disclosure relates to an insert mounted to a tray for transporting semiconductor products, a tray including the insert, and a semiconductor product test system including the insert.

Description of the Related Art

Semiconductor products such as memory modules, which have gone through a production process, are evaluated by undergoing a predetermined test before being finally put on the market. As an example of such memory modules, there are a small outline dual in-line memory module (SO-DIMM), a registered (R)-DIMM, an unregistered (U)-DIMM, a low power compression attached memory module (LPCAMM), etc. Among them, the LPCAMM includes terminals located on the lateral side thereof, unlike other general memory modules including the terminals located on the bottom sides thereof.

The test for the memory module is as follows. The test is conducted in a way of identifying whether the memory module normally operates in an environment similar to that of actual use before release. Specifically, the memory modules are inserted into a socket electrically connected to an actual motherboard (or mainboard), and exchange electric signals with the motherboard, thereby undergoing the test of identifying whether they operate normally. The test carried out as above by actually applying the memory module to the socket in order to identify whether the memory module is normal is called an application test.

To enhance the efficiency of the application test, it is necessary to test multiple memory modules at once. In response to such needs, a conventional test apparatus has included a plurality of sockets and a test tray used for supporting the memory modules to correspond to a socket array. To transport and test the multiple memory modules, the test tray includes a plurality of inserts arranged corresponding to the socket array. The insert has been configured to accommodate the memory module so that the bottom of the memory module can be exposed to the lower side of the test tray. With this configuration, the memory module accommodated in each insert has been inserted in and mounted to the corresponding socket in a state that the test tray is seated in the test apparatus.

Meanwhile, as described above, the semiconductor products formed with the terminals located on the lateral sides thereof have recently been appearing like the LPCAMM. To conduct the application test for such semiconductor products with a high efficiency, it is necessary to use the test tray. However, when such semiconductor products having the terminals located on the lateral sides thereof are inserted into the conventional inserts, the terminals are not exposed toward the socket. Accordingly, in order to use the test tray in the application test for the semiconductor products having the terminals located on the lateral sides thereof, a different type of insert from the conventional one is required.

SUMMARY OF THE INVENTION

An aspect of the disclosure is to provide an insert that allows semiconductor products with terminals located on lateral sides thereof to be applicable to a test tray.

The problems of the disclosure are not limited to the aforementioned problems, and other problems not mentioned above may become apparent to those skilled in the art from the following description.

According to an embodiment of the disclosure, a test tray for testing a semiconductor product may include: a tray; and an insert comprising an accommodating portion configured to accommodate the semiconductor product, and inserted into the tray.

The accommodating portion may have a first posture at a first angle to the tray to accommodate the semiconductor product, and a second posture at a second angle to the tray to test the semiconductor product.

The insert may further include a mounting portion mounted to the tray and supporting the accommodating portion adjustable in angle to the tray.

The accommodating portion may include a rotary body formed with a mounting slot to accommodate the semiconductor product and supported to be adjustable in angle on the mounting portion.

An entrance of the mounting slot is exposed to an upper side of the tray upon the rotary body being in the first posture, and faces toward an inner wall of the tray upon the rotary body being in the second posture.

The accommodating portion may further include a push body facing a rear side of the semiconductor product and formed movably relative to the rotary body, to support the semiconductor product selectively or move the semiconductor product selectively in a certain direction.

An end portion of the push body may protrude from the rotary body to be pressurized in one direction by external force provided from the outside.

The accommodating portion may further include a protrusion restoration elastic member that provides a restoring force to maintain the push body protruding relative to the rotary body.

The push body may include a recess recessed to have a shape corresponding to the rear side of the semiconductor product at an end portion to be in contact with the rear side of the semiconductor product, and accommodates the semiconductor product in the recess while approaching the semiconductor product.

The rotary body may include a shaft serving as a rotary shaft for the rotary body and inserted into the mounting portion movably in an axial direction.

The rotary body may further include a pair of mounting blocks formed with the mounting slots having a width corresponding to thickness of the semiconductor product at end portions thereof adjacent to each other, and spaced apart from each other by a distance corresponding to length of the semiconductor product to accommodate the semiconductor product in a space between the mounting slots different from each other.

The mounting block may include an alignment hole recessed extending parallel to a thickness direction of the accommodated semiconductor product.

The accommodating portion may further include a posture restoration elastic member that provides a restoring force to maintain the rotary body in the first posture or the second posture.

The rotary body further includes a posture securing groove formed to insert an external member therein to interact with the external member and maintain a posture different from a posture restored by the posture restoration elastic member.

According to an embodiment of the disclosure, a test tray for testing a semiconductor product may include: a tray including a plurality of grooves; and an insert configured to accommodate the semiconductor product therein and inserted to the tray so as to be located in the groove.

The semiconductor product may include a first type semiconductor product with terminals located on a lower side thereof, and a second type semiconductor product with terminals located on a lateral side thereof.

The insert may include a first type insert that accommodates the first type semiconductor product therein and exposes a lower end of the first type semiconductor product to a lower side of the tray, and a second type insert that accommodates the second type semiconductor product therein and has a first posture where an entrance through which the second type semiconductor product enters and exits is exposed to an upper side of the tray and a second posture where a lateral side of the accommodated second type semiconductor product is exposed to a lower side of the tray.

The tray may allow the first type insert or the second type insert to be selectively inserted thereto.

According to an embodiment of the disclosure, an insert inserted to a tray for transporting a semiconductor product may include: an accommodating portion formed with a mounting slot to accommodate the semiconductor product; and a mounting portion supporting the accommodating portion to be switchable in posture.

The accommodating portion may have a first posture where an entrance of the mounting slot is exposed to an upper external space of the mounting portion, and a second posture where the mounting slot is exposed to a lower external space of the mounting portion.

According to an embodiment of the disclosure, a semiconductor product test system may include: a tray including a groove; an insert configured to accommodate a semiconductor product therein, inserted to the tray to be located in the groove, and having a first posture at a first angle to the tray and a second posture at a second angle to the tray; and a posture switching unit configured to switch the posture of the insert by pressurizing one side of the insert to change an angle of the insert.

Other details of the disclosure are included in the detailed description and the accompanying drawings.

BRIEF DESCRIPTION OF THE DRAWINGS

FIG. 1 is a block diagram of a semiconductor product test system according to an embodiment of the disclosure.

DETAILED DESCRIPTION OF THE INVENTION

Figure 2:
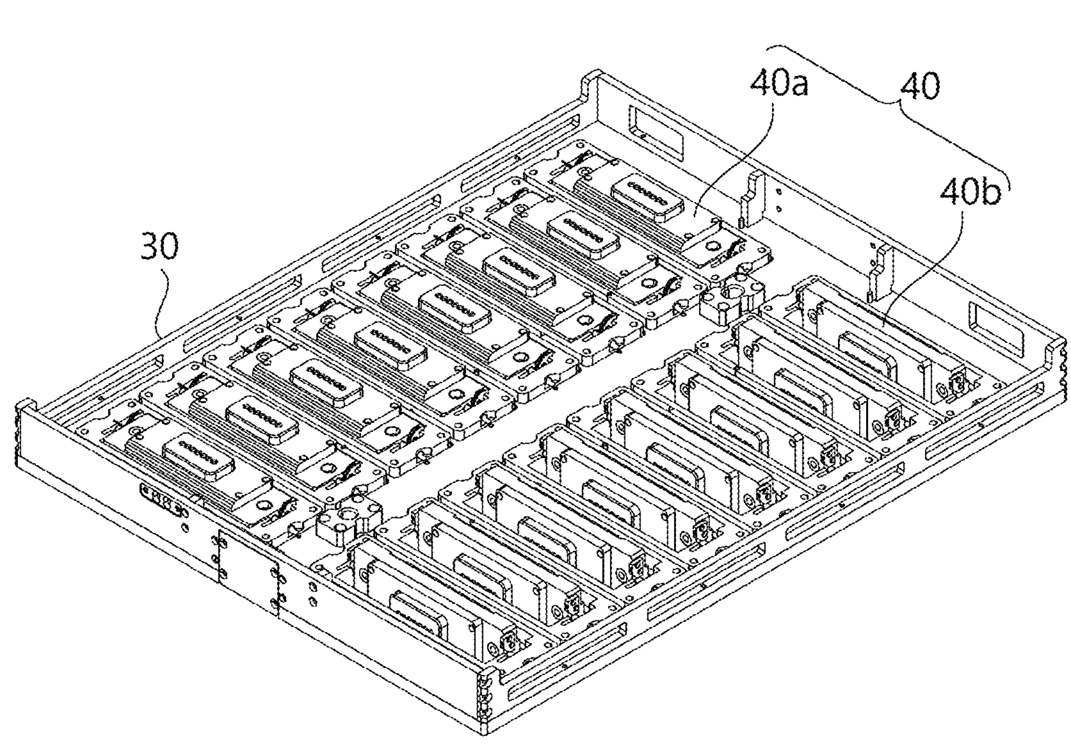
FIG. 2 is a view illustrating a test tray for testing semiconductor products according to an embodiment of the disclosure.

The merits and characteristics of the disclosure and a method for achieving the merits and characteristics will become more apparent from embodiments described below in detail in conjunction with the accompanying drawings. However, the disclosure is not limited to the disclosed embodiments, but may be implemented in various different ways. The embodiments are provided to only complete the disclosure and to allow those skilled in the art to understand the category of the disclosure. The disclosure is defined by the category of the claims.

In addition, embodiments of the disclosure will be described with reference to cross-sectional views and/or schematic views as idealized exemplary illustrations. Therefore, the illustrations may be varied in shape depending on manufacturing techniques, tolerance, and/or etc. Further, elements in the drawings may be relatively enlarged or reduced for convenience of description. Like numerals refer to like elements throughout.

A semiconductor product to be mentioned below may refer to a memory module or the like information processing unit. The semiconductor product may be classified into a first type semiconductor product formed with terminals located on bottom sides thereof, and a second type semiconductor product formed with terminals located on the lateral sides thereof. As an example of the first type semiconductor product, there are a small outline dual in-line memory module (SO-DIMM), a registered (R)-DIMM, an unregistered (U)-DIMM, etc. In addition, as an example of the second type semiconductor product, there is a low power compression attached memory module (LPCAMM), etc.

A tray to be mentioned below may refer to a loading means for loading the semiconductor products in a predetermined array. The tray may be classified into a user tray and a test tray. The user tray may allow the semiconductor products, the number of which is determined in terms of management convenience for a user, to be loaded in a predetermined array. For example, the user tray may load as many semiconductor products as are produced or supplied at one time (hereinafter referred to as 1 LOT). In this regard, the test tray may support the semiconductor products corresponding to the socket arrangement of the test unit. The test tray may include an insert that exposes the terminals of the semiconductor products accommodated therein to the lower side in order to insert the semiconductor products into the sockets.

Direction expressions, such as up, down, left, and right, to be mentioned above and below will be described by setting the remaining directions based on one direction to clearly help the understanding of the disclosure. Therefore, the up, down, left, and right directions may be varied depending on the actual use or application of the disclosure, and the disclosure should be construed to include such varying embodiments.

Below, a semiconductor product test system 1 according to an embodiment of the disclosure will be described with reference to FIG. 1. FIG. 1 is a block diagram of a semiconductor product test system according to an embodiment of the disclosure.

As shown in FIG. 1, the semiconductor product test system 1 according to an embodiment of the disclosure may include a stacker 11, a user tray loader 12, a loading preciser 15, a test tray loader 18, a rack master 20, a test unit 21, a test tray unloader 19, an unloading preciser 17, a user tray unloader 14, a user tray buffer 13, and a test tray buffer 16.

Hereinafter, various transfer units such as conventionally known robot devices, pick and place devices, and transfers may be used to transfer the tray and/or the semiconductor products between the elements included in the semiconductor product test system 1 according to an embodiment of the disclosure.

The stacker 11 may provide a space for loading the user trays. Although not shown, the stacker 11 may be classified into a loading stacker where the user trays loaded with the semiconductor products before undergoing the test are stored, and an unloading stacker and/or a retest stacker where the user trays loaded with the semiconductor products after undergoing the test are stored. Here, the unloading stacker may store the user trays loaded with the semiconductor products that have been tested and graded. Further, the retest stacker may store the user trays loaded with the semiconductor products that need to be tested again. The stacker 11 may include a transfer unit installed to pick up and transfer the user tray from the loading stacker to the user tray loader 12. Further, the stacker 11 may include a transfer unit installed to collect the user trays from the user tray unloader 14 and place them in the unloading stacker and/or the retest stacker.

The user tray loader 12 may provide a stage where the user trays stand by as they are adjacent to the loading preciser 15. The test tray may be loaded into the loading preciser 15, and the loading preciser 15 may open the insert of the loaded test tray. Here, the open insert may mean that the insert is in a state to accommodate the semiconductor products therein. Between the user tray loader 12 and the loading preciser 15, the semiconductor product transfer unit may be installed to pick up the semiconductor product from the user tray and mount the semiconductor product to the open insert.

The test tray loader 18 may collect the test tray when the semiconductor products are accommodated in each insert in the loading preciser 15, and then transfer the test tray to the rack master 20. The rack master 20 may refer to a transfer unit that transfers the test tray accommodated from the test tray loader 18 to each test unit 21. The test units 21 may be arranged along a lengthwise direction with respect to the rack master 20, and in some cases, may also be arranged as stacked in a height direction. The rack master 20 may remember or identify the location of each test unit 21, and transfer the test tray to the test unit 21, whose turn is to receive the test tray, among the plurality of test units 21

The test unit 21 may include a plurality of sockets arranged corresponding to the inserts arranged in the test tray. A board on which the plurality of sockets is formed in the test unit 21 will be referred to as a test board. When the test tray is matched and seated on the test board, the semiconductor product accommodated in each insert may be electrically connected to the socket. The socket may have a connection means for electrically connecting the terminals of the semiconductor product to the motherboard. For example, the connection means may be provided as at least one of various conventional means such as a pogo pin, an electrode pad, and a rubber socket pad.

The test tray that has been tested in the test unit 21 may be collected again by the rack master 20 and transferred to the test tray unloader 19. The test tray unloader 19 may transfer the accommodated test tray to the unloading preciser 17. The unloading preciser 17 may open the insert of the accommodated test tray.

Meanwhile, the user tray unloader 14 may provide the stage where an empty user tray stands by as it is adjacent to the unloading preciser 17. Between the unloading preciser 17 and the user tray unloader 14, the semiconductor product transfer unit may be installed to pick up the semiconductor product from the open test tray and load the semiconductor product into the empty user tray. When the semiconductor product is completely loaded into the user tray, the user tray in the user tray unloader 14 may be transferred to and stored in the unloading stacker and/or the retest stacker.

The user tray buffer 13 may provide a temporary storage space for the user tray and/or the semiconductor product so that a transportation flow of the user tray can be maintained smoothly. For example, the user tray buffer 13 may be used as a temporary storage place for the semiconductor product that has been evaluated as a retest grade. Further, the user tray buffer 13 may be used as a temporary storage place for an additionally transferred user tray when the user tray unloader 14 unloads the semiconductor products sorted according to grades. As another example, when only the semiconductor products of the same grade are loaded into one user tray, the user tray buffer 13 may be used as a space where the user tray, which has not yet been fully filled, stands by until it is fully loaded with the semiconductor products.

The test tray buffer 16 may provide a space through which the test tray, from which all the semiconductor products have been unloaded in the unloading preciser 17, passes before being transferred to the loading preciser 15. The test trays may be transferred in sequence from the test tray buffer 16 to the loading preciser 15. The loading preciser 15 may transfer the test tray loaded with the semiconductor product to be tested to the test tray loader 18, receive the empty test tray from the test tray buffer 16, and open the insert.

Below, the test tray for testing the semiconductor products and the insert mounted thereto according to an embodiment of the disclosure will be described with reference to the description of the aforementioned semiconductor product test system 1 according to an embodiment of the disclosure. The insert mounted to the tray for transporting the semiconductor product according to an embodiment of the disclosure is mounted to the test tray, and thus used in the semiconductor product test system 1 according to an embodiment of the disclosure.

FIG. 2 is a view illustrating a test tray for testing the semiconductor product according to an embodiment of the disclosure. In this case, a tray 30 for testing the semiconductor product according to an embodiment of the disclosure may serve as the test tray 2.

Referring to FIG. 2, the tray 30 may be inserted with a plurality of inserts 40. The insert 40 may be detachably coupled to the tray 30 so as to be placed in a groove (i.e., a space where the insert is located in the tray) formed in the tray 30. Because any one of various conventional coupling structures is selectable as a structure for coupling the insert 40 to the tray 30, detailed descriptions thereof will be omitted. Meanwhile, the insert 40 may be loosely coupled to the tray 30 so that the insert 40 can move to some extent while being mounted to the tray 30. In the example of FIG. 2, two rows of the inserts 40 are mounted to the tray 30, each row including eight inserts 40, but the number of inserts 40 may be changed in various ways.

Meanwhile, two different types of inserts may be combined in each groove of the tray 30. To this end, the inserts may include a first type insert (not shown) and a second type insert 40 which have the same or similar coupling structure. Therefore, a user may select the first type insert and the second type insert 40 as necessary and mount them to the tray 30.

The first type insert may refer to an insert that supports the first type semiconductor product so that the bottom of the first type semiconductor product can be exposed to the lower side of the tray 30 (see the downward direction in FIG. 2). The first type insert may be provided to have insert structures for various conventional semiconductor products, which have been designed to support the first type semiconductor product. Because the first type insert may be based on the related art, the detailed descriptions thereof will be omitted.

Meanwhile, in FIG. 2, the insert mounted to the tray 30 may be the second type insert 40 according to an embodiment of the disclosure. The second type insert 40 may refer to an insert formed for the application test of the second type semiconductor product. The second type insert 40 may be adjusted in angle between a first posture where an entrance through which the second type semiconductor product enters and exits is exposed to the upper side of the tray 30 and a second posture where a lateral side of the accommodated second type semiconductor product is exposed to the lower side of the tray 30, and may be switched over between the first and second postures. For example, the second type semiconductor product in the first posture may be perpendicular to the tray 30 or the groove of the tray 30. Further, for example, the second type semiconductor product in the second posture may be parallel to the tray 30 or the groove of the tray 30. Hereinafter, the description will be made on the assumption that an angle between the first posture and the second posture is the right angle, but the disclosure is not limited thereto.

In this case, referring to FIG. 2, inserts 40*b* arranged in the right row of the tray 30 takes the first posture, and inserts 40*a* arranged in the left row of the tray 30 takes the second posture. The insert 40 may take the first posture or the second posture as a default posture when no external force is applied by a built-in posture restoration elastic member (to be described later). For convenience of description, the second posture will be described below as the default posture. However, a person having ordinary skill in the art to which disclosure pertains can easily make modification to take the first posture as the default posture with reference to the following description, and the disclosure should be construed as extending its scope to such an embodiment.

The second type semiconductor product may move down vertically from above the second type insert 40 of the first posture, and be accommodated in the second type insert 40. In this case, the second type semiconductor product may be mounted to the second type insert 40 so that the lateral side where the terminals are located can be exposed toward the front of the second type insert 40. Accordingly, when the second type insert 40 is switched over to the second posture, the terminals of the second type semiconductor product may be exposed toward the lower side of the tray 30.

Figure 3:
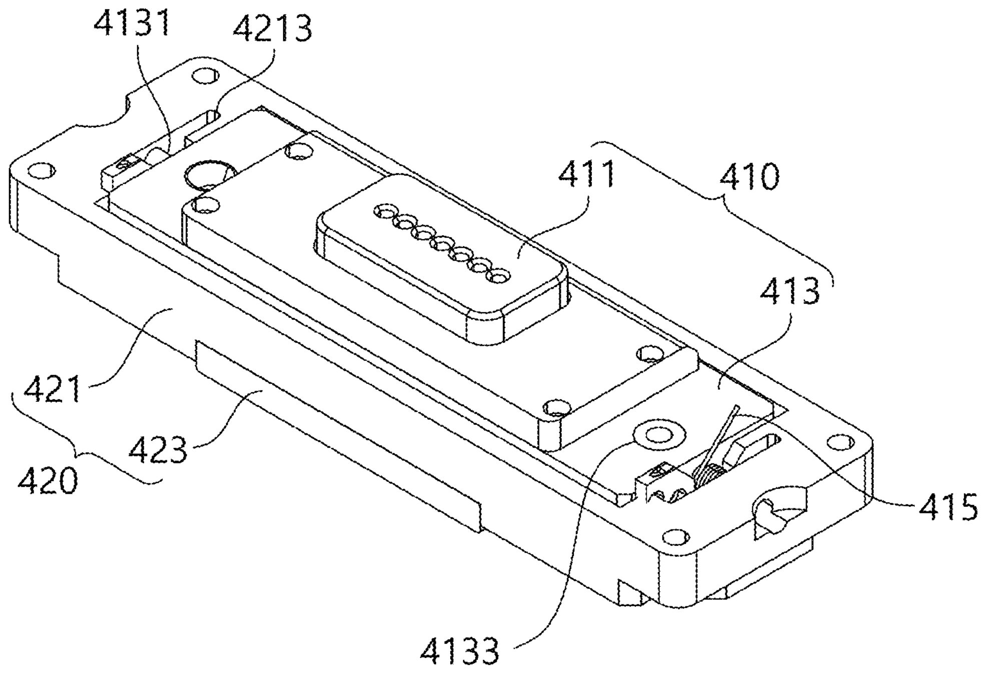
FIG. 3 is a view illustrating an insert according to an embodiment of the disclosure, viewed from above in a state that external force is not applied to the insert.

Below, referring to FIGS. 3 and 4, the insert 40 according to an embodiment of the disclosure provided as the second type insert will be described. FIG. 3 is a view illustrating an insert according to an embodiment of the disclosure, viewed from above in a state that external force is not applied to the insert. In this regard, FIG. 4 is a view illustrating an insert according to an embodiment of the disclosure, viewed from below in a state that external force is not applied to the insert.

Figure 4:
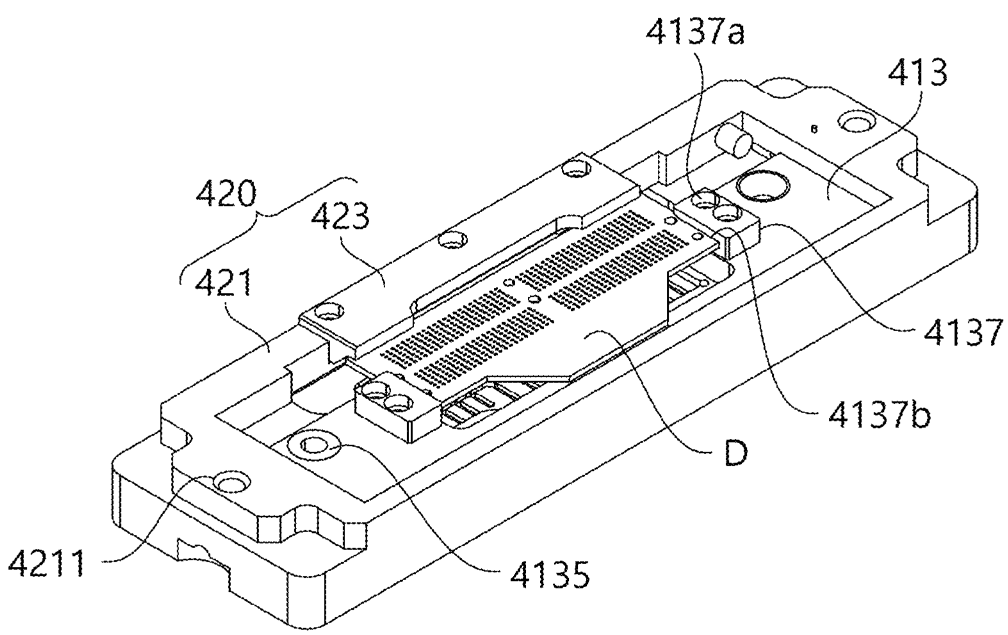
FIG. 4 is a view illustrating an insert according to an embodiment of the disclosure, viewed from below in a state that external force is not applied to the insert.

Referring to FIGS. 3 and 4, the insert 40 according to an embodiment of the disclosure may take the second posture as the default posture when no external force is applied thereto. In this case, a portion where the terminals are located in a semiconductor product D (e.g., the second type semiconductor product) may be exposed to the external space below the insert 40.

As such, the insert 40 may include a mounting portion 420 and an accommodating portion 410. The mounting portion 420 may refer to a portion movably coupled to the tray 30 (see FIG. 2). The mounting portion 420 may include a mounting frame 421 and a guide frame 423.

First, the mounting frame 421 may have a coupling structure to be coupled to the tray 30, and may also have a structure for being stably seated on the test board. The mounting frame 421 may be shaped similarly to but slightly smaller than the groove formed in the tray 30. For example, the mounting frame 421 may be shaped like a rectangular frame with a hollow center.

An alignment hole 4211 may be formed penetrating a lower end portion of the mounting frame 421 in the height direction. The alignment hole may refer to a hole formed to align the position of a member, in which the alignment hole is formed, by inserting an alignment pin having a corresponding shape. Hereinafter, the alignment hole 4211 formed in the lower end portion the mounting frame 421 will be referred to as a seating alignment hole 4211 to be distinguished from other alignment holes formed on the insert 40.

The seating alignment hole 4211 may be located at the lowermost portion of the insert 40, compared to other alignment holes. The seating alignment hole 4211 may accommodate the alignment pin protruding from the test board while the tray 30 is seated on the test board. the insert 40 may move relative to the tray 30 in the process of accommodating the alignment pin in the seating alignment hole 4211, and aligned with the sockets when the alignment pin is completely accommodated in the seating alignment hole 4211.

The guide frame 423 may be accommodated in a groove formed on the test board while being seated on the test board. To this end, the test board may include a groove recessed to have a shape corresponding to the guide frame 423. The insert 40 may be first aligned with the socket while the guide frame 423 is seated on the test board, and further aligned with the socket as the alignment pin is accommodated in the seating alignment hole 4211.

Further, the guide frame 423 may set the lower limit of the semiconductor product D moving down. To this end, the guide frame 423 may protrude from the lower end portion of the mounting frame 421 toward the central hollow space of the mounting frame 421. In this case, the guide frame 423 may protrude toward the hollow space to such an extent that it does not obscure the terminals on the lateral side of the semiconductor product D that has moved down as much as possible.

The accommodating portion 410 may refer to a portion supported to be adjusted in angle relative to the tray 30 by the mounting portion 420, and accommodating the semiconductor product D. The accommodating portion 410 may be adjusted in angle relative to the tray 30 and switched over between the first posture and the second posture as described above. The accommodating portion 410 may have a first angle relative to the tray 30 in the first posture, and a second angle relative to the tray 30 in the second posture. For example, the first angle may be 90 degrees, and the second angle may be 0 degrees or 180 degrees.

As such, the accommodating portion 410 may include a rotary body 413 and a push body 411.

The rotary body 413 may be supported to be adjustable in angle on the mounting frame 421. To this end, shafts 4131 to be inserted and accommodated into the mounting frame 421 may protrude from both ends of the rotary body 413. A pair of shafts 4131 may be arranged coaxially with each other and serve as the rotary axis of the rotary body 413. Each shaft 4131 may be inserted into a shaft accommodating groove 4213 formed in the mounting frame 421. The shaft accommodating groove 4213 may be formed by recessing or penetrating an inner center portion of the mounting frame 421 toward the outside. However, the disclosure is not limited to this embodiment. Alternatively, the shaft accommodating groove 4213 may be formed in the rotary body 413 and the shaft 4131 may protrude from the mounting frame 421.

The inner diameter of the shaft accommodating groove 4213 may be slightly larger than the diameter of the shaft 4131. Further, a distance between a first end and a second end of the two accommodating grooves 4213 facing each other may be longer than a distance between both ends of the shafts 4131 forming a pair. Therefore, in the state that the pair of shafts 4131 are respectively inserted into the shaft accommodating grooves 4213, the pair of shafts 4131 may be coupled to the mounting frame 421 as loosely as possible so that the pair of shafts 4131 can move not only in an axial direction but also in forward/backward/up/down directions. The movement of the pair of shafts 4131 may allow the rotary body 413 to be aligned with the socket while moving relative to the mounting frame 421.

The accommodating portion 410 may include a posture restoration elastic member 415 that provides restoring force to maintain the rotary body 413 in the second posture. For example, the posture restoration elastic member 415 may be provided as a coil spring and arranged to surround the shaft 4131. The posture restoration elastic member 415 may elastically support the rotary body 413 to be maintained at the second angle as a first end portion of the posture restoration elastic member 415 is in contact with the rotary body 413. Regarding this, additional descriptions will be made later. In this case, as described above, according to an embodiment, the posture restoration elastic member 415 may also support the rotary body 413 to be maintained at the first angle.

Meanwhile, the central portion of the rotary body 413 may be perforated vertically. For example, the rotary body 413 may be provided in the form of a roughly quadrangular frame having a hollow central portion. An end portion of the push body 411 may be accommodated in the hollow space inside the rotary body 413. The push body 411 may approach the semiconductor product D through the hollow space in the center of the rotary body 413. The push body 411 may be coupled to the rotary body 413 so that its first end can be located in the central hollow space of the rotary body 413 and its second end can protrude out of the rotary body 413.

Although not shown, the accommodating portion 410 may include a protrusion restoration elastic member that provides restoring force to keep the push body 411 protruding from the rotary body 413 when external force is not applied thereto. The protrusion restoration elastic member may be disposed between the push body 411 and the rotary body 413, and elastically support the push body 411 with respect to the rotary body 413. The protrusion restoration elastic member may be provided by various elastic members known in the related art as long as it can maintain the push body 411 in the protruding state. For example, the protrusion restoration elastic member may include a coil spring.

A pair of mounting blocks 4137 may be placed at the end portions of the rotary body 413. The mounting block 4137 may be exposed to the lower side of the tray 30 (see FIG. 2) when the rotary body 413 is in the second posture. The pair of mounting blocks 4137 may be formed with a mounting slot 4137*b* extending in a direction, in which the semiconductor product D is accommodated, in the first posture. Detailed descriptions about the mounting slot 4137*b* will be described later with reference to FIG. 8.

The mounting block 4137 may be formed with an alignment hole 4137*a* extending parallel to the thickness direction of the accommodated semiconductor product D (i.e., a direction of being seated on the test board in the second posture; a vertical direction; a direction of pressing the push body). The alignment hole 4137*a* formed in the mounting block 4137 will be referred to as a fine-adjustment alignment hole 4137*a* to be distinguished from other alignment holes. The fine-adjustment alignment hole 4137*a* may be formed to interact with an external alignment pin and ultimately align the position of the rotary body 413.

With the rotary body 413 being in the second posture, the push body 411 protruding upward from the rotary body 413 may be pressed downward by an external pressurization module. For example, the pressurization module may be installed above the test board in the test unit 21 (see FIG. 1)

With the push body 411 being lowered as much as possible, the push body 411 may come into contact with a surface of the semiconductor product D opposite to the surface to be in close contact with the socket (i.e., the surface where the terminals are located). For example, the push body 411 may simply serve to support the rear side of the semiconductor product D so that the semiconductor product D can spread out during the application test. In this case, the mounting block 4137 may simply hold the semiconductor product D in place.

As another example, the push body 411 may press the rear side of the semiconductor product D and move the semiconductor product D in the direction of being pressed by the pressurization module. In this case, the mounting block 4137 may be coupled to the frame 413*a* (see FIG. 7), which forms the framework of the rotary body 413, movably along the pressurization direction. For convenience of description, it will be described by way of example that the push body 411 is just in contact with the rear side of the semiconductor product D so that the semiconductor product D can maintain as spread out.

Meanwhile, an upper alignment hole 4133 exposed to upward and a lower alignment hole 4135 exposed downward may be formed in the height direction while penetrating the rotary body 413 in the first posture. In this case, the upper alignment hole 4133 may be used to align the rotary body 413 by interacting with the alignment pin formed on the external pressurization module. In this regard, the lower alignment hole 4135 may be used to align the rotary body 413 by interacting with the alignment pin formed on the test board.

Figure 5:
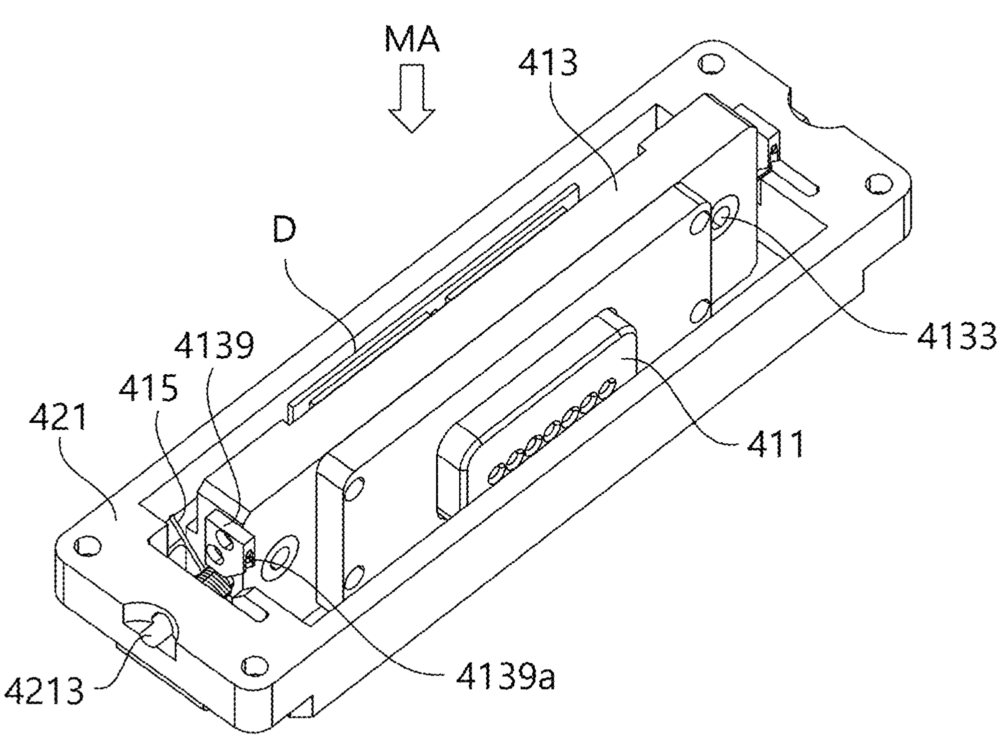
FIG. 5 is a view illustrating an insert according to an embodiment of the disclosure, viewed from back when it is in a first posture.

Below, the first posture of the insert 40 according to an embodiment of the disclosure will be described with reference to FIGS. 5 and 6. FIG. 5 is a view illustrating an insert according to an embodiment of the disclosure, viewed from back when it is in the first posture. In this regard, FIG. 6 is a view illustrating an insert according to an embodiment of the disclosure, viewed from front when it is in the first posture.

Figure 6:
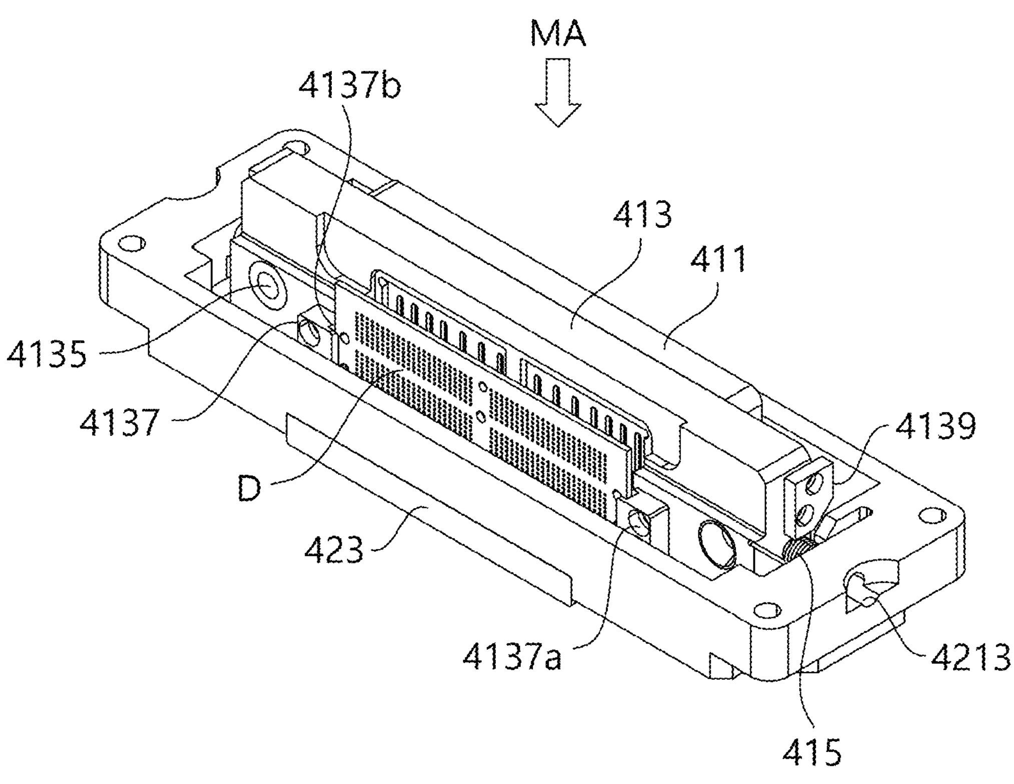
FIG. 6 is a view illustrating an insert according to an embodiment of the disclosure, viewed from front when it is in a first posture.

The state shown in FIGS. 5 and 6 may refer to a state in which the rotary body 413 overcomes the elastic force of the posture restoration elastic member 415 and is then rotated vertically by external factors. The rotary body 413 may be in the state of FIGS. 5 and 6 when the rotary body 413 is pressed by external force and rotated 90 degrees clockwise.

In more detail, when external force is applied to the rotary body 413 to rotate the rotary body 413 counterclockwise, elastic member support blocks 4139 located at both ends of the rotary body 413 and accommodating the end portions of the posture restoration elastic member 415 may press the ends of the posture restoration elastic member 415 and compress the posture restoration elastic member 415 counterclockwise.

Briefly, the descriptions about the elastic member supporting blocks 4139 are as follows. The elastic member supporting blocks 4139 are provided as a pair and located at both ends of the rotary body 413 so as to be adjacent to the shafts 4131. The elastic member supporting block 4139 may be formed with an elastic member accommodating groove 4139*a* recessed in a straight line. In this case, the posture restoration elastic member 415 provided in the form of a coil spring may have a straight protruding end to be accommodated in the elastic member accommodating groove 4139*a*. The posture restoration elastic member 415 may provide counterclockwise elastic force to the elastic member supporting block 4139 through the protruding end being in contact with the elastic member supporting block 4139.

As shown in FIGS. 5 and 6, when the rotary body 413 is switched over to the first posture, the entrance of the mounting slot 4137*b* may be exposed to the external upper space of the insert 40. In this case, the semiconductor product D may move down in a mounting direction MA from above the space between the pair of mounting blocks 4137 and be accommodated between the mounting blocks 4137. Thereafter, when the external force is not applied to the rotary body 413, the rotary body 413 accommodating the semiconductor product D therein may be rotated clockwise by the posture restoration elastic member 415 and switched over to the second posture.

Figure 7:
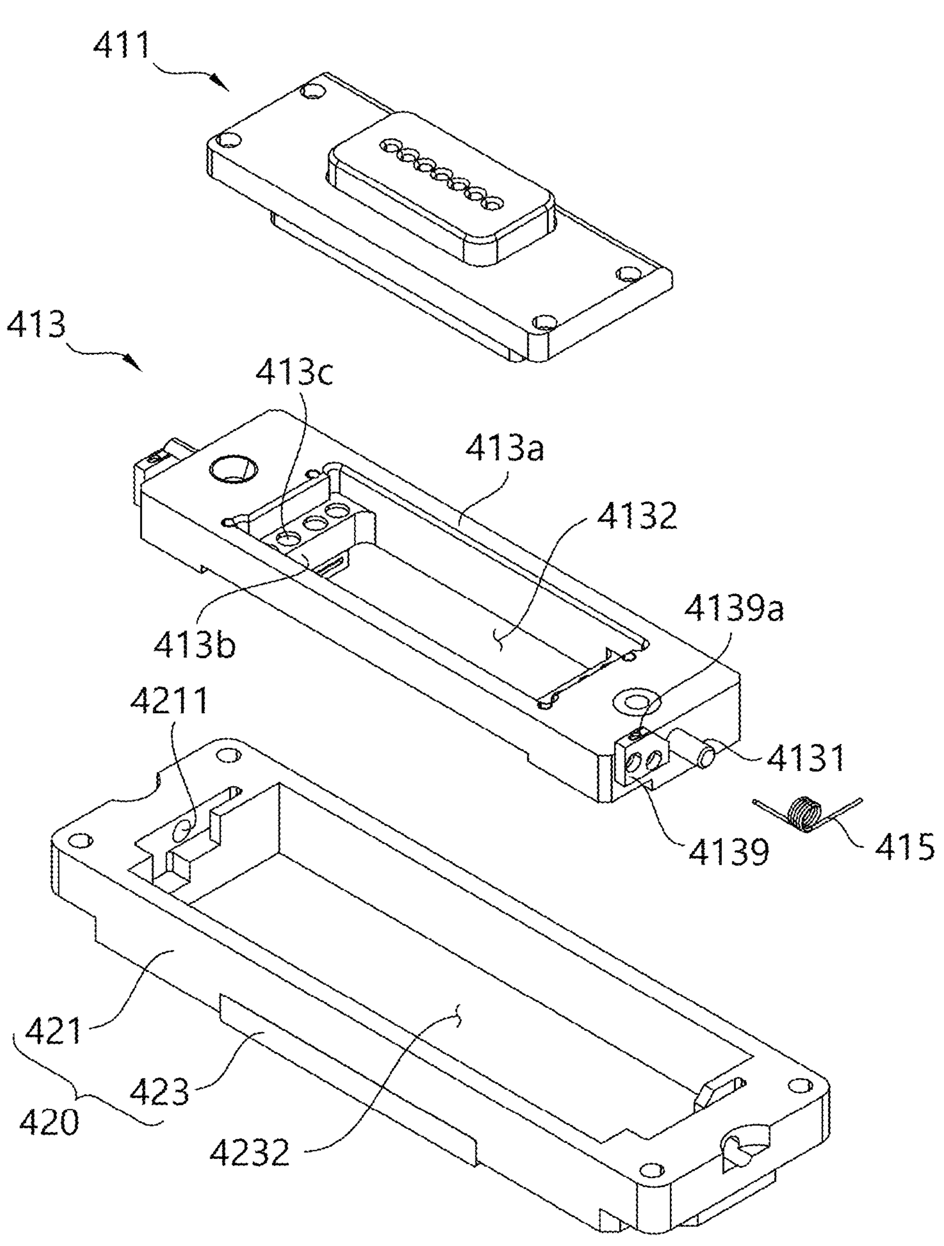
FIG. 7 is an exploded perspective view of an insert according to an embodiment of the disclosure.

Below, coupling relationships between the elements of the insert 40 according to an embodiment of the disclosure will be described with reference to FIG. 7. FIG. 7 is an exploded perspective view of an insert according to an embodiment of the disclosure.

As shown in FIG. 7, the push body 411, the rotary body 413, and/or the mounting frame 421 may be assembled into the insert 40 according to an embodiment of the disclosure in such a manner that the push body 411 is accommodated in a push body accommodating space 4132 formed inside the rotary body 413, and the rotary body 413 is accommodated in a rotary body accommodating space 4232 formed inside the mounting frame 421.

The push body accommodating space 4132 may be provided to be slightly larger than the size of the push body 411 so that the push body 411 and the rotary body 413 can be coupled having clearance therebetween. The push body accommodating space 4132 may be provided as an inner space of a rotary frame 413*a* forming the main framework of the rotary body 413.

The rotary frame 413*a* may be shaped like a rectangular frame internally formed with a hollow, and include support protrusions 413*b* protruding from the bottom portion toward the inner space. The support protrusions 413*b* may refer to frames protruding from both inner walls of the rotary frame 413*a* to limit the moving distance of the push body 411. The push body 411 to be pressed by external force may move down until it comes into contact with the support protrusion 413*b* inside the push body accommodating space 4132. In this case, a protrusion restoration elastic member may be placed between the support protrusion 413*b* and the push body 411. The support protrusion 413*b* may be formed with a support groove 413*c* recessed to prevent the protrusion restoration elastic member from interfering with the maximum downward movement of the push body 411. The support groove 413*c* may partially accommodate the protrusion restoration elastic member when no external force is applied thereto, and may entirely accommodate the protrusion restoration elastic member compressed when the push body 411 is lowered as much as possible.

Meanwhile, the width of the rotary body accommodating space 4232 may be wide enough to prevent the rotary body 413 from being in contact with the mounting frame 421 between the first posture and the second posture. The shafts 4131 may be respectively coupled to the shaft accommodating grooves 4211 exposed to the rotary body accommodating space 4232. In this case, the posture restoration elastic member 415 may be mounted to at least one of the pair of shafts 4131.

Figure 8:
FIG. 8 is a perspective view of a rotary body according to an embodiment of the disclosure.
Figure 8:
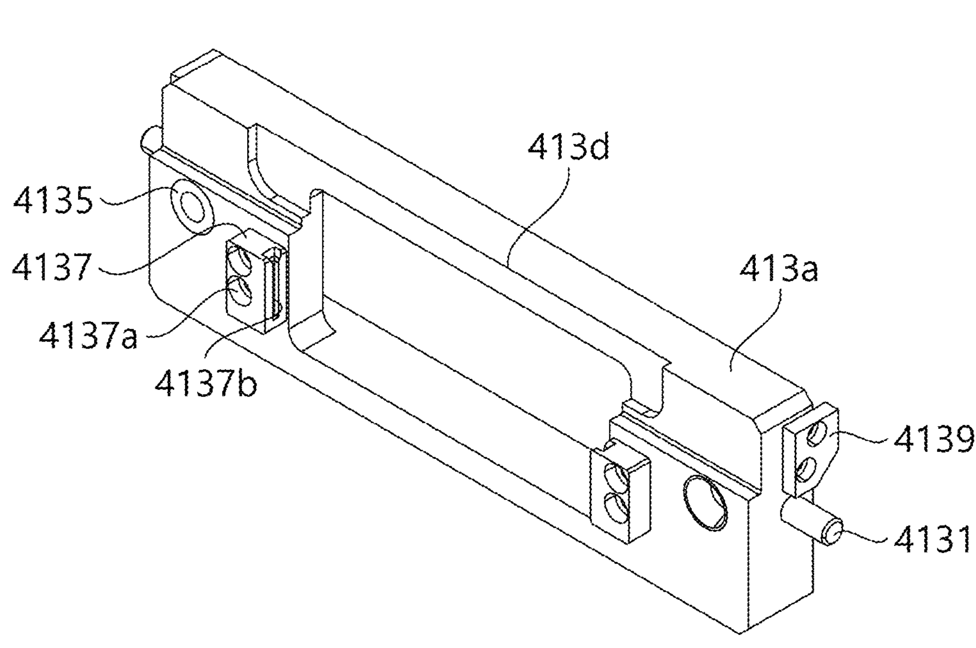
Figure 9:
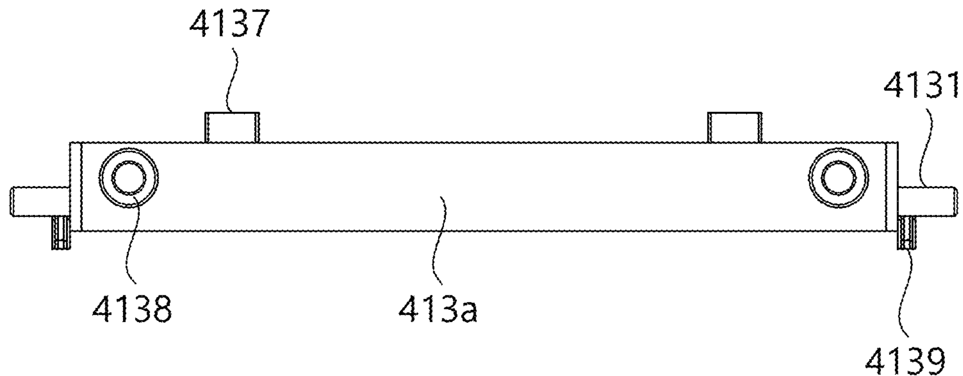
FIG. 9 is a bottom view of a rotary body according to an embodiment of the disclosure.

Below, the rotary body 413 according to an embodiment of the disclosure will be described in detail with reference to FIGS. 8 and 9. FIG. 8 is a perspective view of a rotary body according to an embodiment of the disclosure. In this regard, FIG. 9 is a bottom view of a rotary body according to an embodiment of the disclosure.

For convenience of description, descriptions will be made in connection with FIGS. 8 and 9, a portion of the rotary body 413 where the mounting blocks 4137 are located will be referred to as the front surface of the rotary body 413, and a direction in which the front of the rotary body 413 faces will be referred to as a front direction.

Referring to FIG. 8, a guide frame accommodating groove 413*d* may be formed on the front top of the rotary frame 413*a*. The guide frame accommodating groove 413*d* may refer to a portion that accommodates the upper end portion of the guide frame 423 when the rotary frame 413*a* is in the second posture. According to an embodiment, the guide frame 423 may be in contact with the front surface of the rotary frame 413*a* in the second posture. In this case, the guide frame 423 may serve as a stopper that limits the rotation angle of the rotary body 413 to 90 degrees.

Further, the guide frame 423 may prevent the semiconductor product D from being completely separated from the insert 40 even though the semiconductor product D is separated from the mounting slot 4137*b* while the rotary frame 413*a* is rotated from the second posture to the first posture. In more detail, the guide frame 423 may protrude from the lower side of the semiconductor product D, which is in the first posture, toward the push body accommodating space 4132, thereby limiting the downward movement of the semiconductor product D. As a result, the guide frame 423 prevents the complete separation of the semiconductor product D, thereby preventing damage to the semiconductor product D due to the separation of the semiconductor product D.

Further, the guide frame 423 may serve to guide the position of the semiconductor product D when the semiconductor product D in the second posture is inserted into the mounting slot 4137*b*. In more detail, the semiconductor product D may be in contact with the guide frame 423 protruding toward the push body accommodating space 4132, thereby limiting its downward height. Further, in some cases, an inclined surface may be formed on a portion of the guide frame 423, which comes into contact with the semiconductor product D, thereby guiding the semiconductor product D moving downward. In this case, the semiconductor product D may move down along the inclined plane and be mounted to the insert 40 in a correct position.

Meanwhile, the pair of mounting blocks 4137 may be symmetrically arranged facing each other on the front surface of the rotary frame 413*a*. The mounting slot 4137*b* may be formed at an end portion of the mounting block 4137 adjacent to another mounting block 4137 (i.e., a surface facing another mounting block). To accommodate the semiconductor product, the width of the mounting slot 4137*b* may correspond to the thickness of the semiconductor product.

The entrance of the mounting slot 4137*b* may be exposed to the upper side of the tray in the first posture, and may lie to face toward the inner wall of the tray in the second posture. In more detail, the mounting slot 4137*b* includes an upper end extending up to the top of the mounting block 4137 to form the entrance, and a lower end extending vertically downward and positioned higher than the lower end of the mounting block 4137. Therefore, the mounting slot 4137*b* may be open at the top and closed at the bottom.

Further, the mounting slot 4137*b* may have an entrance, the width of which is formed to be wider than other portions, becomes smaller downward, and extends up to the bottom while maintaining the minimum width when reaching the minimum width. In this case, the minimum width may be equal to or slightly larger than the thickness of the semiconductor product. Because the entrance of the mounting slot 4137*b* is widest at the top and gradually becomes narrower, the semiconductor product may slide along the inner wall of the mounting slot 4137*b* and align with the mounting block 4137 while being inserted into the mounting block 4137 even though the semiconductor product is loaded into the mounting slot 4137*b* in a slightly misaligned state.

The maximum distance between the mounting slots 4137*a* formed in each mounting block 4137 may correspond to the lateral length of the semiconductor product. Such a distance is to secure a space for the semiconductor product to be accommodated between the mounting blocks 4137.

Referring to FIG. 9, a posture securing groove 4138 may be formed penetrating the bottom of the rotary frame 413*a* and extending toward the top. The posture securing groove 4138 may refer to a groove into which an external object is inserted to maintain the rotary frame 413*a* in the first posture. When an external object is inserted into the posture securing groove 4138, the rotary body 413 is supported by the external object, thereby overcoming the elastic force of the posture restoration elastic member 415 and maintaining the first posture. According to an alternative embodiment where the second posture is the default posture unlike that in this embodiment, the posture securing groove 4138 may be used to maintain the rotary body 413 in the second posture.

Figure 10:
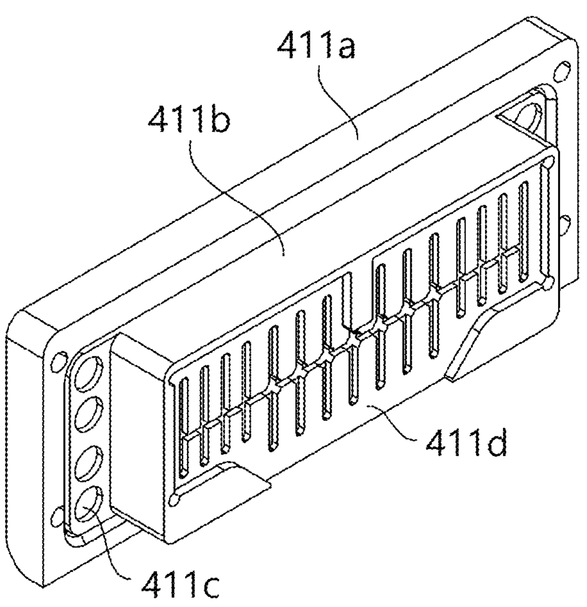
FIG. 10 is a view illustrating a push body according to an embodiment of the disclosure.

Below, the push body 411 according to an embodiment of the disclosure will be additionally described with reference to FIG. 10. FIG. 10 is a view illustrating a push body according to an embodiment of the disclosure.

As shown in FIG. 10, the push body 411 according to an embodiment of the disclosure may include a base block 411*a* and a push block 411*b*. The base block 411*a* may include a first end accommodated in the push body accommodating space 4132 (see FIG. 7), and a second end protruding outward from the push body accommodating space 4132. The base block 411*a* may include a first end portion formed corresponding to the size of the push body accommodating space 4132, and a second end portion formed corresponding to the external pressurization module.

Meanwhile, an elastic member groove 411*c* may be formed as recessed toward the second end at a position adjacent to the push block 411*b* in the first end of the base block 411*a*. The elastic member groove 411*c* may face the support groove 413*c* (see FIG. 7) while the push body 411 is accommodated in the push body accommodating space 4132. When the elastic member groove 411*c* is present, a portion of the protrusion restoration elastic member may be accommodated in the support groove 413*c* and the other portion may be accommodated in the elastic member groove 411*c* in a maximum compressed state.

The push block 411*b* may extend from the center portion of the first end of the base block 411*a*, and the recess 411*d* recessed to correspond to the lateral shape of the semiconductor product may be formed at the first end. When the recess 411*d* is formed, at least a portion of the semiconductor product may be accommodated in the recess 411*d* in the state that the push body 411 is maximally pressed. The push block 411*b* may support the semiconductor product as its surface with the recess 411*d* in contact with the rear side of the semiconductor product. The recess 411*d* may have an effect on ultimately aligning the semiconductor product accommodated in the mounting slot 4137*b* (see FIG. 8).

Below, a posture switching unit 50, which can be used in the semiconductor product test system according to an embodiment of the disclosure will be described with reference to FIGS. 11 to 17 based on the foregoing description. According to an embodiment of the disclosure, the posture switching unit 50 may be provided to perform an operation of opening the insert 40 in the loading preciser 15 (see FIG. 1) and/or the unloading preciser 17 (see FIG. 1). For example, the posture switching unit 50 may switch the posture of the insert 40 over from the second posture to the first posture by adjusting the angle of the insert 40.

Figure 11:
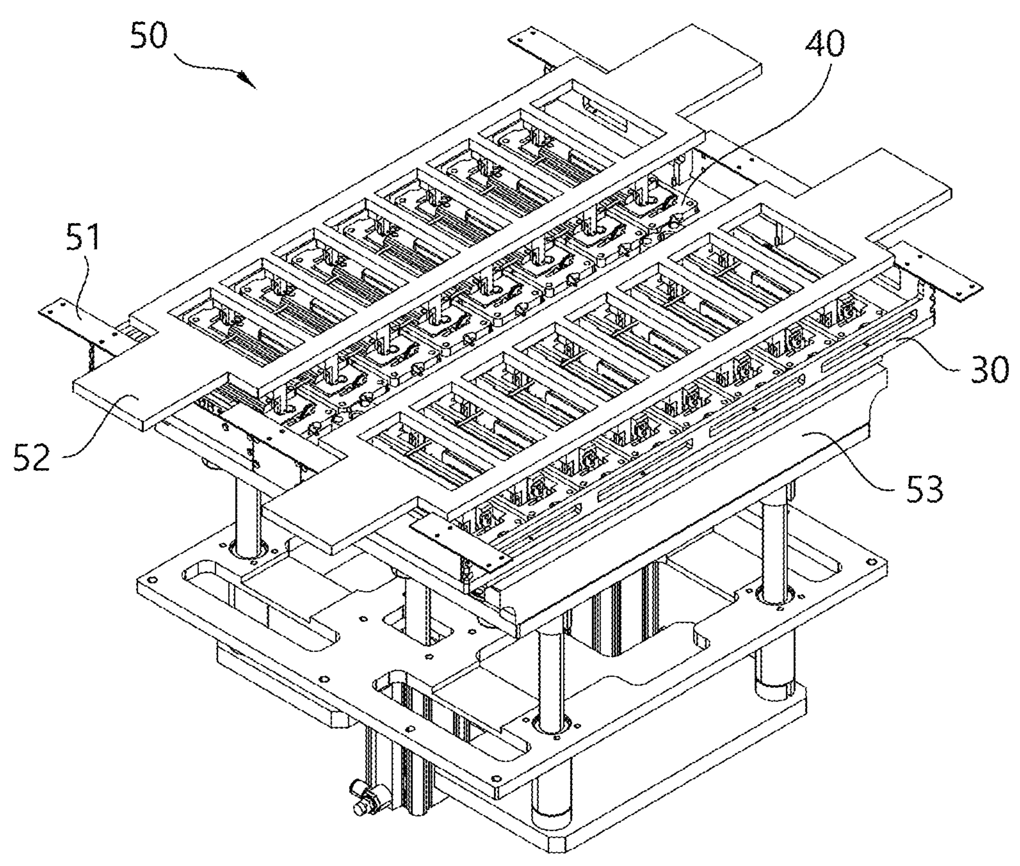
FIG. 11 is a view illustrating that a tray is mounted to a posture switching unit according to an embodiment of the disclosure.

First, FIG. 11 is a view illustrating that a tray is mounted to a posture switching unit according to an embodiment of the disclosure. In this regard, FIG. 12 is a view illustrating the posture switching unit of FIG. 11, viewed at another angle.

Figure 12:
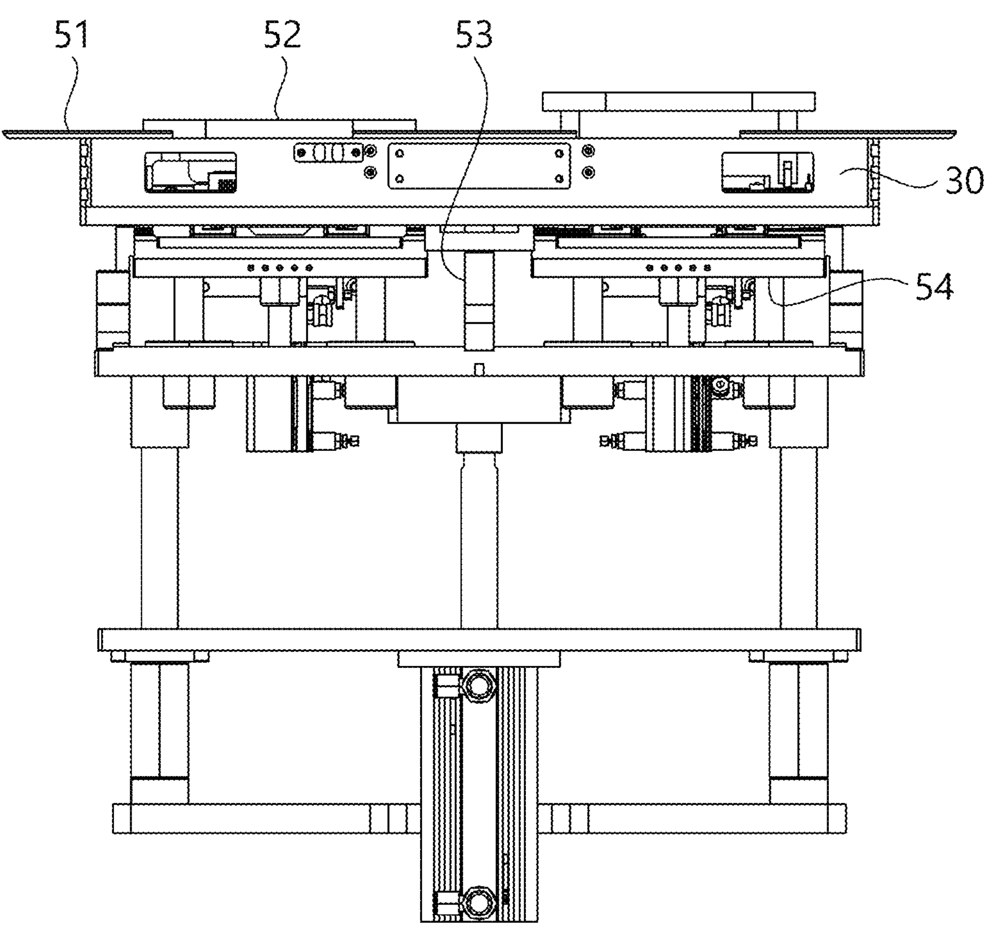
FIG. 12 is a view illustrating the posture switching unit of FIG. 11, viewed at another angle.

As shown in FIGS. 11 and 12, the posture switching unit 50 according to an embodiment of the disclosure may include a hard stopper 51, an insert opening module 52, a tray lifting module 53, and an insert securing module 54.

First, the tray 30 may be loaded and/or mounted to the posture switching unit 50 between the hard stopper 51 and the tray lifting module 53. The hard stopper 51 may be a straight frame secured directly above the front and rear ends of the loaded tray 30. The tray lifting module 53 provides a stage on which the tray 30 is seated, and may include a cylinder to lift the stage. The tray lifting module 53 may stand by in an initial state lowered as much as possible, and perform a lifting operation after the tray 30 is loaded on the stage.

The insert opening modules 52 are provided as a pair, and may each operate to open the inserts 40 in one row. However, the number of insert opening modules 52 is not necessarily limited to two, and the insert opening modules 52 may be provided as many as the number of rows of the inserts 40 formed in the tray 30. The insert opening modules 52 may be provided to move up and down independently of each other above the hard stopper 51. For example, the insert opening module 52 may be connected to the cylinder so as to move up and down.

Referring to FIG. 12, FIG. 12 shows that the left insert opening module 52 is lowered as much as possible and the right insert opening module 52 is positioned at the maximum height in the state that the tray 30 is lifted by the tray lifting module 53. To show the movable range of the insert opening module 52, the two insert opening modules 52 shown in FIG. 12 operate individually. However, the pair of insert opening modules 52 may be set to operate together or independently as needed by a user.

The insert securing modules 54 may be provided in the same number as the insert opening modules 52, and move up and down together with the stage of the tray lifting module 53. Like the insert opening modules 52, the insert securing modules 54 may be provided to interact with one of the rows of the inserts 40. The insert securing module 54 may stand by as lowered as much as possible in the initial state. The insert securing module 54 may move up after the insert opening module 52 located directly above the insert securing module 54 moves down as low as possible and opens the insert 40. When the insert securing module 54 moves up as high as possible, the insert 40 may be secured in the open state.

Figure 13:
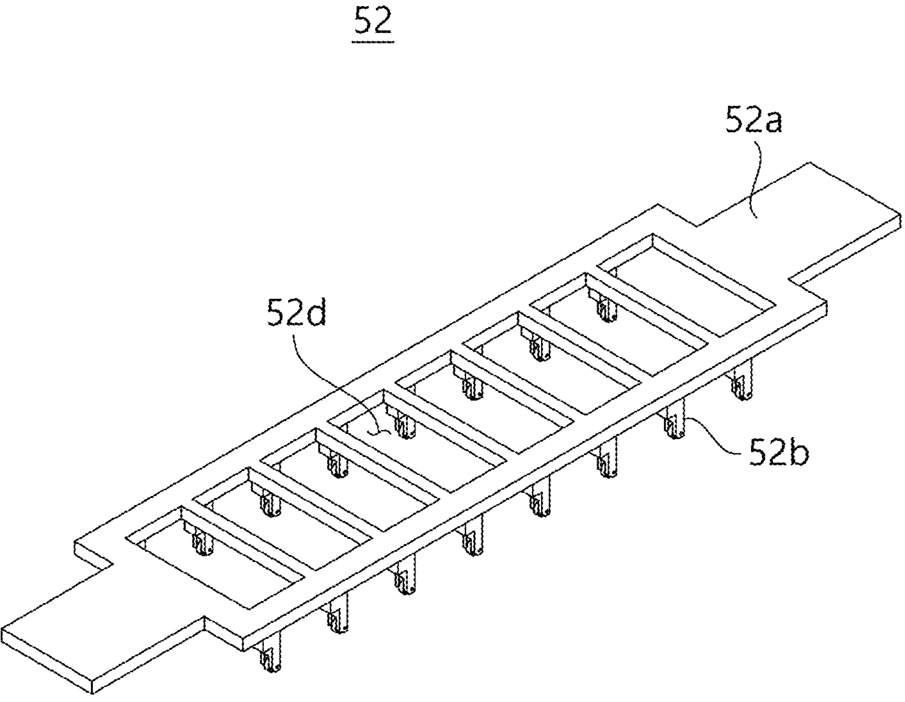
FIG. 13 is a view illustrating an insert opening module according to an embodiment of the disclosure.

Below, the insert opening module 52 of the disclosure will be described in detail with reference to FIGS. 13 and 14. FIG. 13 is a view illustrating an insert opening module according to an embodiment of the disclosure. In this regard, FIG. 14 is a lateral view illustrating an insert opening module according to an embodiment of the disclosure.

Figure 14:
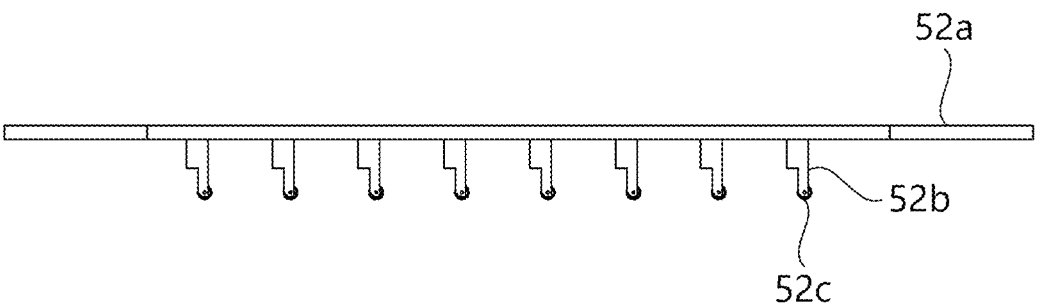
FIG. 14 is a lateral view illustrating an insert opening module according to an embodiment of the disclosure.

As shown in FIGS. 13 and 14, the insert opening module 52 according to an embodiment of the disclosure may include an opening module frame **52*a*, an opening module leg 52*b*, and a pressurization wheel 52*c***.

The opening module frame **52*a* may be a frame that has a length corresponding to the length of the tray 30 and a width corresponding to the width of the insert 30 in one row. The opening module frame 52*a* may move up and down by an external driving unit. An opening 52*d* may be formed penetrating a place of the opening module frame 52*a*, which is located directly above the insert 40 mounted to the tray 30. The opening 52*d*** may be formed to enable the insert, which has been opened as switched over to the first posture, to mount or pick up the semiconductor product.

The opening module leg **52*b* may extend downward from both sides of the opening 52*d*. The opening module leg 52*b* may be positioned eccentrically forward or backward with respect to the center of the opening 52*d*. A pressurization wheel 52*c* may be rotatably mounted to the bottom of the opening module leg 52*b*. The pressurization wheel 52*c* may include a roller that moves down along the opening module leg 52*b* and presses the insert 40**.

Below, an insert opening operation of the posture switching unit 50 according to an embodiment of the disclosure will be described with reference to FIGS. 15 to 17.

Figure 15:
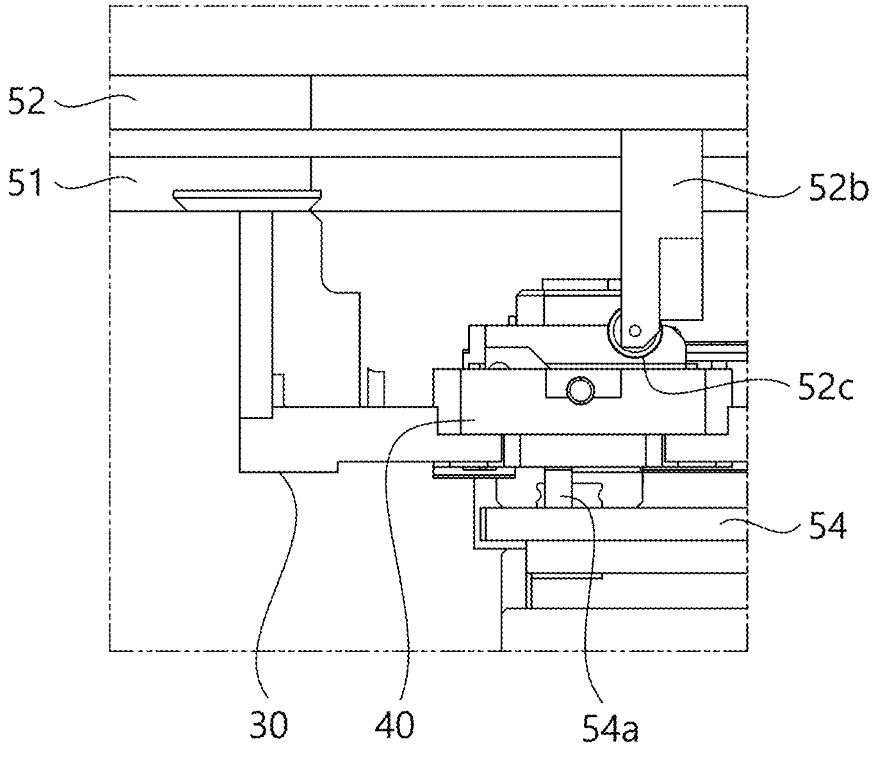
FIG. 15 is a view illustrating that a tray is in contact with a hard stopper according to an embodiment of the disclosure.

FIG. 15 is a view illustrating that a tray is in contact with a hard stopper according to an embodiment of the disclosure. When the test tray 2 is loaded on the posture switching unit 50, the tray lifting module 53 (see FIG. 12) may move up to lift the tray 30. The tray 30 may be continuously lifted by the tray lifting module 53 until the top of the tray 30 comes into contact with the hard stopper 51. When the tray lifting module 53 moves up as high as possible, the tray 30 is in close contact with the hard stopper 51 and thus its posture is secured. In this case, the insert 40 may maintain the second posture, and the insert opening module 52 may stand by above the hard stopper 51 and/or the insert 40.

Figure 16:
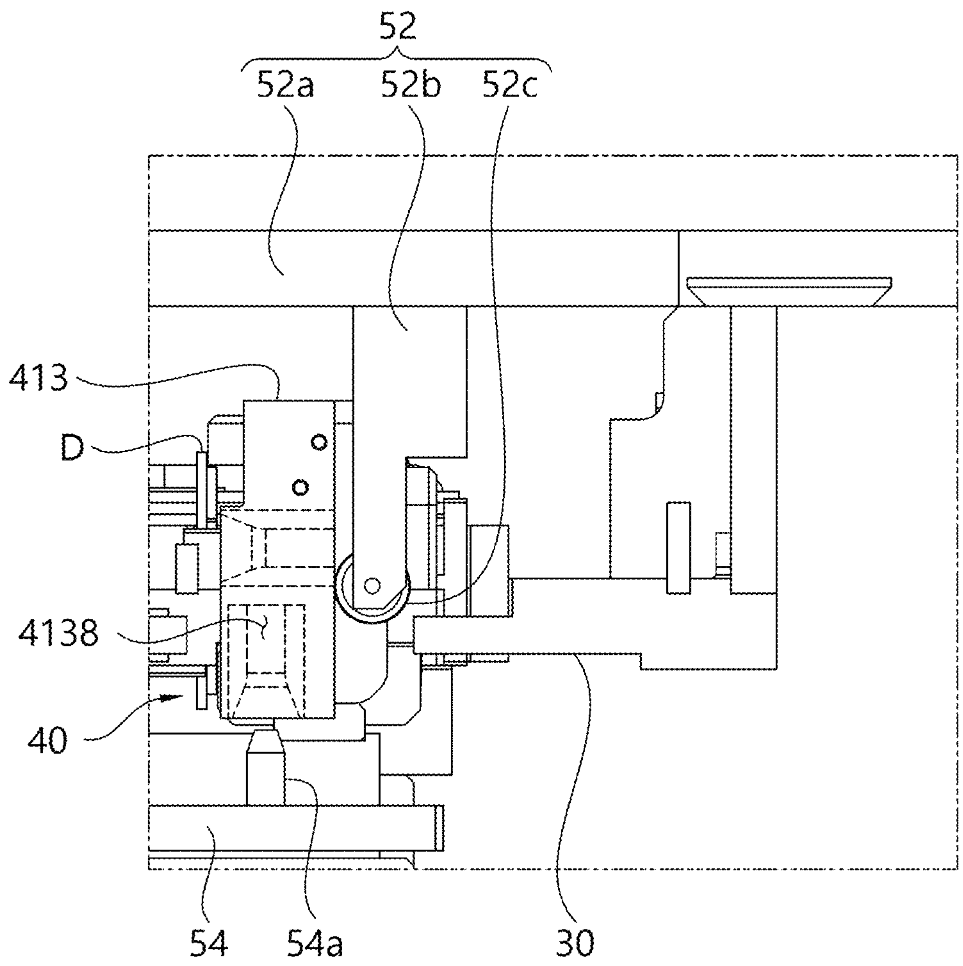
FIG. 16 is a view illustrating that an insert opening module is lowered as much as possible according to an embodiment of the disclosure.

Continuing the description with reference to FIG. 16, FIG. 16 is a view illustrating that an insert opening module is lowered as much as possible according to an embodiment of the disclosure. As shown in FIG. 16, when the insert opening module 52 moves down as low as possible, the insert 40 may be switched over to the first posture.

This may be because the opening module leg **52*b* is positioned eccentrically with respect to the opening 52*d* (see FIG. 13) and thus the pressurization wheel 41*c* presses an eccentric position from the center of the rotary body 413. Therefore, the pressurization wheel 52*c* may provide torque to the rotary body 413 in the opposite direction to the elastic force of the posture restoration elastic member 415 (see FIG. 3). Briefly, referring to FIG. 3 together, the pressurization wheel 52*c* may pressurize the upper surface of the rotary body 413 that does not face the guide frame 423. For example, on the assumption that the guide frame 423 is located in front of the mounting portion 420, the pressurization wheel 52*c* may pressurize the rotary body 413 while moving down at a position behind the shaft 4141**.

In this case, the pressurization wheel **52*c* may pressurize the rotary body 413, and rotates in the opposite direction to the rotary body 413. Therefore, according to an embodiment of the disclosure, the posture of the rotary body 413 is smoothly switched over as pressurized by the pressurization wheel 52*c*, thereby minimizing damage to the insert 40** due to pressurization.

Meanwhile, when the insert 40 is switched over to the first posture, a securing rod **54*a* of the insert securing module 54 may be located directly below the insert 40. The securing rod 54*a* may refer to a shaft-like member that protrudes upward at a position facing the posture securing groove 4138 (see FIG. 17) of the insert 40 which has been switched over to the first posture by the insert opening module 52**.

Figure 17:
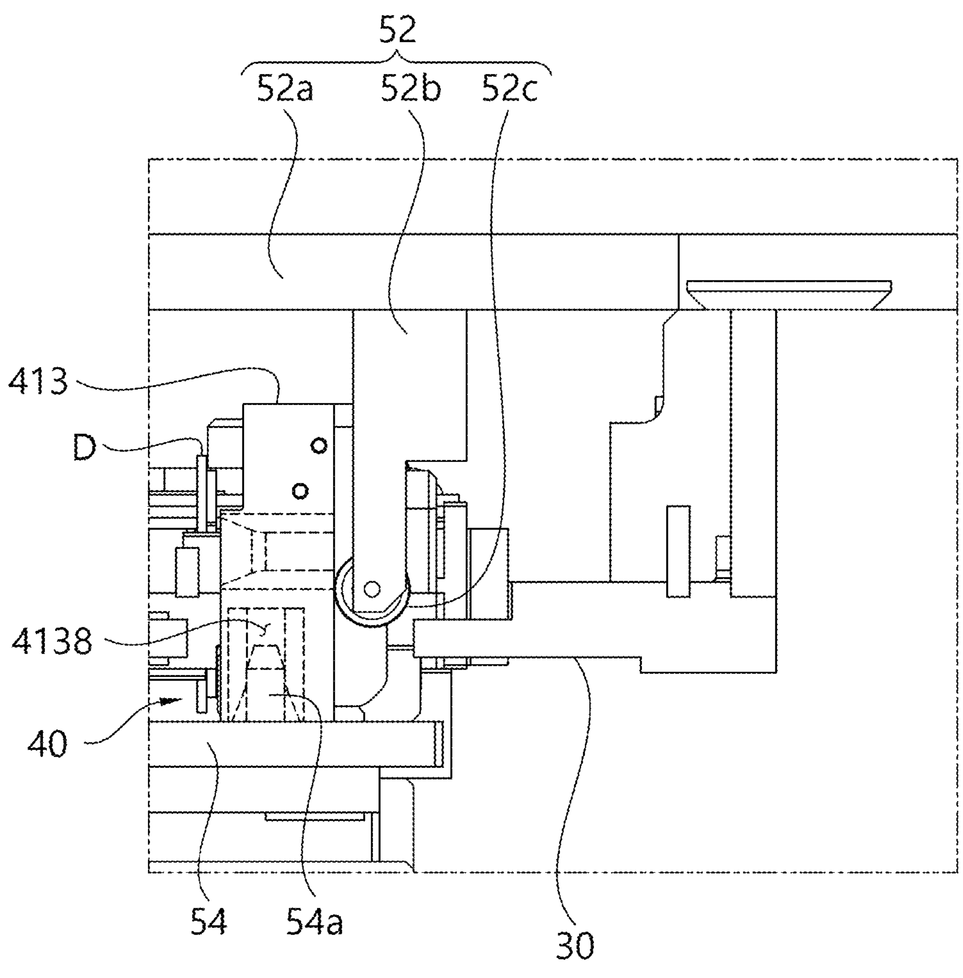
FIG. 17 is a view illustrating that an insert securing module is raised as much as possible according to an embodiment of the disclosure.

Referring to FIG. 17, the operation of securing the insert 40 by the insert securing module 54 will be described. FIG. 17 is a view illustrating that an insert securing module is raised as much as possible according to an embodiment of the disclosure. As shown in 17, when the insert securing module 54 moves up as high as possible, the securing rod **54*a* may be inserted into the posture securing groove 4138**.

The securing rod 54*a* is inserted in the posture securing groove 4138 and prevents the rotation of the insert 40 so that the insert 40 can be stably maintained in the first posture. After the insert 40 is secured by the insert securing module 54, the insert opening module 52 may move up again according to an embodiment and then the semiconductor product D may be mounted to the insert 40 or collected from the insert 40. Alternatively, the insert opening module 52 may not move up and the semiconductor product D may pass through the opening 52*d* (see FIG. 13) so as to be mounted to the insert 40 or collected from the insert 40.

Meanwhile, the foregoing description shows an example that the insert opening module 52 is located above the tray 30 and the insert securing module 54 is located below the tray 30. However, such locations may vary depending on embodiments. For example, the insert opening module 52 may rotate the insert 40 below the tray 30, and the insert securing module 54 may secure the insert 40 above the tray 30. Alternatively, both the insert opening module 52 and the insert securing module 54 may operate above or below the tray 30.

Further, the foregoing description illustrates that the push body 411 is an element of the insert 40. However, in some cases, the push body 411 may be provided in not the insert 40 but the external pressurization module. In this case, the push body 411 may be moved down by the external pressurization module and selectively inserted into the rotary body 413, thereby pressurizing the semiconductor product D.

Meanwhile, an electrostatic discharge (ESD) material and/or coating may be applied to portions to be in direct contact with the semiconductor product D in the tray 30 and/or the insert 40 of the semiconductor product test system 1 according to an embodiment of the disclosure. For example, the ESD material and/or coating may include a non-metallic material having a surface resistance of 5 to 8. For example, such a non-metallic material may include materials such as MCNYLON, PEEK, and POM, or the like similar plastic materials.

Further, for example, the ESD material and/or coating may be applied to the guide frame 423, the push body 411 and/or the mounting block 4137. Therefore, according to an embodiment of the disclosure, the ESD material is applied to the portions to be in direct contact with the semiconductor product D in order to prevent static electricity from generation during loading, unloading and/or contact with the semiconductor product D, thereby preventing damage to the semiconductor product D due to the static electricity.

According to the embodiments of the disclosure, the effects are at least as follows.

An application test for semiconductor products with terminals located on a lateral side thereof is improved in efficiency.

The effects of the disclosure are not limited to those described above, and various other effects are included in the foregoing description.

A person having ordinary knowledge in the art to which the disclosure pertains may understood that the disclosure may be embodied in other specific forms without changing technical spirit or essential features. Accordingly, the embodiments described above are illustrative and not restrictive in all aspects. The scope of the disclosure is defined by the appended claims rather than the foregoing detailed description, and all changes or modifications derived from the meaning and scope of the appended claims and their equivalents are construed as falling within the scope of the disclosure.

| *Reference Numerals | |
|---|---|
| 1: semiconductor product test system | |
| 2: test tray | |
| 11: stacker | 12: user tray loader |
| 13: user tray buffer | 14: user tray unloader |
| 15: loading preciser | 16: test tray buffer |
| 17: unloading preciser | 18: test tray loader |
| 19: test tray unloader | 20: rack master |
| 21: test unit | |
| 30: tray | 40: insert |
| 410: accommodating portion | 411: push body |
| 411a: base block | 411b: push block |
| 411c: elastic member groove | 411d: recess |
| 413: rotary body | 413a: rotary frame |
| 413b: support protrusion | 413c: support groove |
| 413d: guide frame accommodating groove | |
| 4131: shaft | |
| 4132: push body accommodating space | |
| 4133: upper alignment hole | |
| 4135: lower alignment hole | |
| 4137: mounting block | |
| 4137a: fine adjustment alignment hole | |
| 4137b: mounting slot | |
| 4138: posture securing groove | |
| 4139: elastic member supporting block | |
| 4139a: elastic member accommodating groove | |
| 415: posture restoration elastic member | |
| 420: mounting portion | 421: mounting frame |
| 4211: seating alignment hole | |
| 4213: shaft accommodating groove | |
| 423: guide frame | |
| 4232: rotary body accommodating space | |
| 50: posture switching unit | 51: hard stopper |
| 52: insert opening module | |
| 52a: opening module frame | 52b: opening module leg |
| 52c: pressurization wheel | 52d: opening |
| 53: tray lifting module | |
| 54: insert securing module | |
| 54a: securing rod | D: semiconductor product |

What is claimed is:

1. A test tray for testing a semiconductor product, comprising:

a tray; and an insert comprising an accommodating portion configured to accommodate the semiconductor product, and inserted into the tray; and wherein the accommodating portion having a first posture at a first angle to the tray to accommodate the semiconductor product, and a second posture at a second angle to the tray to test the semiconductor product, wherein the insert further comprises a mounting portion mounted to the tray and supporting the accommodating portion adjustable in angle to the tray, and wherein the accommodating portion comprises a rotary body formed with a mounting slot to accommodate the semiconductor product and supported to be adjustable in angle on the mounting portion.

2. The test tray of claim 1, wherein an entrance of the mounting slot is exposed to an upper side of the tray upon the rotary body being in the first posture, and faces toward an inner wall of the tray upon the rotary body being in the second posture.

3. The test tray of claim 1, wherein the accommodating portion further comprises a push body facing a rear side of the semiconductor product and formed movably relative to the rotary body, to support the semiconductor product selectively or move the semiconductor product selectively in a certain direction.

4. The test tray of claim 3, wherein an end portion of the push body protrudes from the rotary body to be pressurized in one direction by external force provided from the outside.

5. The test tray of claim 4, wherein the accommodating portion further comprises a protrusion restoration elastic member that provides a restoring force to maintain the push body protruding relative to the rotary body.

6. The test tray of claim 3, wherein the push body comprises a recess recessed to have a shape corresponding to the rear side of the semiconductor product at an end portion to be in contact with the rear side of the semiconductor product, and accommodates the semiconductor product in the recess while approaching the semiconductor product.

7. The test tray of claim 1, wherein the rotary body comprises a shaft serving as a rotary shaft for the rotary body and inserted into the mounting portion movably in an axial direction.

8. The test tray of claim 7, wherein the rotary body further comprises a pair of mounting blocks formed with the mounting slots having a width corresponding to thickness of the semiconductor product at end portions thereof adjacent to each other, and spaced apart from each other by a distance corresponding to length of the semiconductor product to accommodate the semiconductor product in a space between the mounting slots different from each other.

9. The test tray of claim 8, wherein the mounting block comprises an alignment hole recessed extending parallel to a thickness direction of the accommodated semiconductor product.

10. The test tray of claim 1, wherein the accommodating portion further comprises a posture restoration elastic member that provides a restoring force to maintain the rotary body in the first posture or the second posture.

11. The test tray of claim 10, wherein the rotary body further comprises a posture securing groove formed to insert an external member therein to interact with the external member and maintain a posture different from a posture restored by the posture restoration elastic member.

12. A test tray for testing a semiconductor product, comprising:

a tray comprising a plurality of grooves; and an insert configured to accommodate the semiconductor product therein and inserted to the tray so as to be located in the groove, the semiconductor product comprising a first type semiconductor product with terminals located on a lower side thereof, and a second type semiconductor product with terminals located on a lateral side thereof, the insert comprising a first type insert that accommodates the first type semiconductor product therein and exposes a lower end of the first type semiconductor product to a lower side of the tray, and a second type insert that accommodates the second type semiconductor product therein and has a first posture where an entrance through which the second type semiconductor product enters and exits is exposed to an upper side of the tray and a second posture where a lateral side of the accommodated second type semiconductor product is exposed to a lower side of the tray, and the tray allowing the first type insert or the second type insert to be selectively inserted thereto.

13. An insert inserted to a tray for transporting a semiconductor product, comprising:

an accommodating portion formed with a mounting slot to accommodate the semiconductor product; and a mounting portion supporting the accommodating portion to be switchable in posture, and the accommodating portion having a first posture where an entrance of the mounting slot is exposed to an upper external space of the mounting portion, and a second posture where the mounting slot is exposed to a lower external space of the mounting portion.

14. A semiconductor product test system comprising:

a tray comprising a groove;

an insert configured to accommodate a semiconductor product therein, inserted to the tray to be located in the groove, and having a first posture at a first angle to the tray and a second posture at a second angle to the tray; and a posture switching unit configured to switch the posture of the insert by pressurizing one side of the insert to change an angle of the insert.

* * * * *